United States Patent
Jeong et al.

(10) Patent No.: US 10,753,980 B2
(45) Date of Patent: Aug. 25, 2020

(54) METHOD AND APPARATUS TO DETECT BATTERY FAULT

(71) Applicant: SAMSUNG ELECTRONICS CO., LTD., Suwon-si (KR)

(72) Inventors: Ji-young Jeong, Hwaseong-si (KR); YoungHun Sung, Hwaseong-si (KR); DongKee Sohn, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 208 days.

(21) Appl. No.: 15/861,893

(22) Filed: Jan. 4, 2018

(65) Prior Publication Data

US 2019/0033376 A1    Jan. 31, 2019

(30) Foreign Application Priority Data

Jul. 26, 2017 (KR) .................. 10-2017-0094706

(51) Int. Cl.
    *G01R 31/382* (2019.01)
    *G06F 17/11* (2006.01)
    *H01M 10/48* (2006.01)
    *H01M 10/42* (2006.01)

(52) U.S. Cl.
    CPC ............ *G01R 31/382* (2019.01); *G06F 17/11* (2013.01); *H01M 10/482* (2013.01); *H01M 2010/4278* (2013.01)

(58) Field of Classification Search
    CPC ............... G01R 31/382; G01R 31/396; G01R 31/3648; G06F 17/11; H01M 10/482; H01M 2010/4278
    See application file for complete search history.

(56) References Cited

U.S. PATENT DOCUMENTS

| | | | |
|---|---|---|---|
| 7,567,116 B2 * | 7/2009 | Yoshio ............... | H01M 10/425 327/535 |
| 7,733,059 B2 * | 6/2010 | Yoshida ............... | H01M 10/42 320/118 |
| 8,334,699 B2 | 12/2012 | Asakura et al. | |
| 10,396,570 B2 * | 8/2019 | Loncarevic .......... | H02J 7/0016 |
| 2010/0201321 A1 * | 8/2010 | Asakura ............... | G01R 31/025 320/132 |
| 2013/0026994 A1 * | 1/2013 | Morikawa .......... | H01M 10/425 320/134 |
| 2014/0184235 A1 | 7/2014 | Ikeuchi et al. | |

FOREIGN PATENT DOCUMENTS

| | | |
|---|---|---|
| JP | 2985613 B2 | 12/1999 |
| JP | 2011-257411 A | 12/2011 |
| JP | 5117537 B2 | 1/2013 |
| JP | 2014-160039 A | 9/2014 |
| KR | 10-2009-0006919 A | 1/2009 |

* cited by examiner

*Primary Examiner* — Mohamed Charioui
(74) *Attorney, Agent, or Firm* — NSIP Law

(57) ABSTRACT

A processor-implemented method to detect a battery fault includes obtaining first states of detection targets in a battery, generating a representative state based on the first states, generating second states by applying the representative state to each of the first states, generating one or more third states by amplifying at least a portion of the second states, and detecting for a fault of the battery based on the one or more third states.

28 Claims, 12 Drawing Sheets

FIG. 3
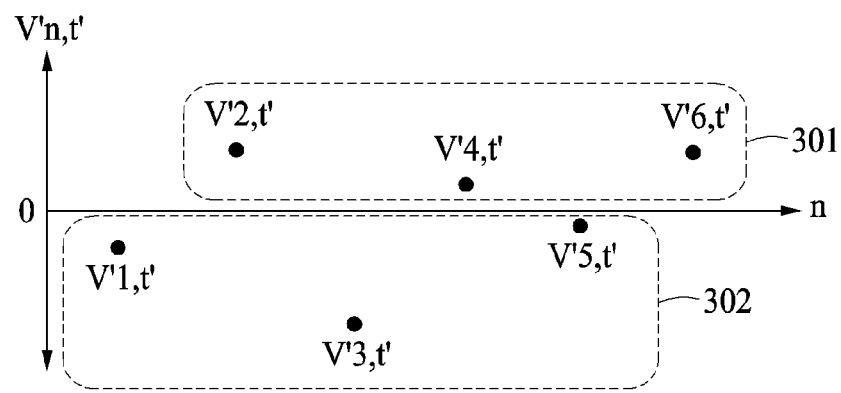
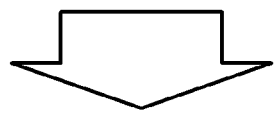
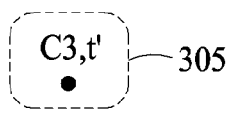

FIG. 9A
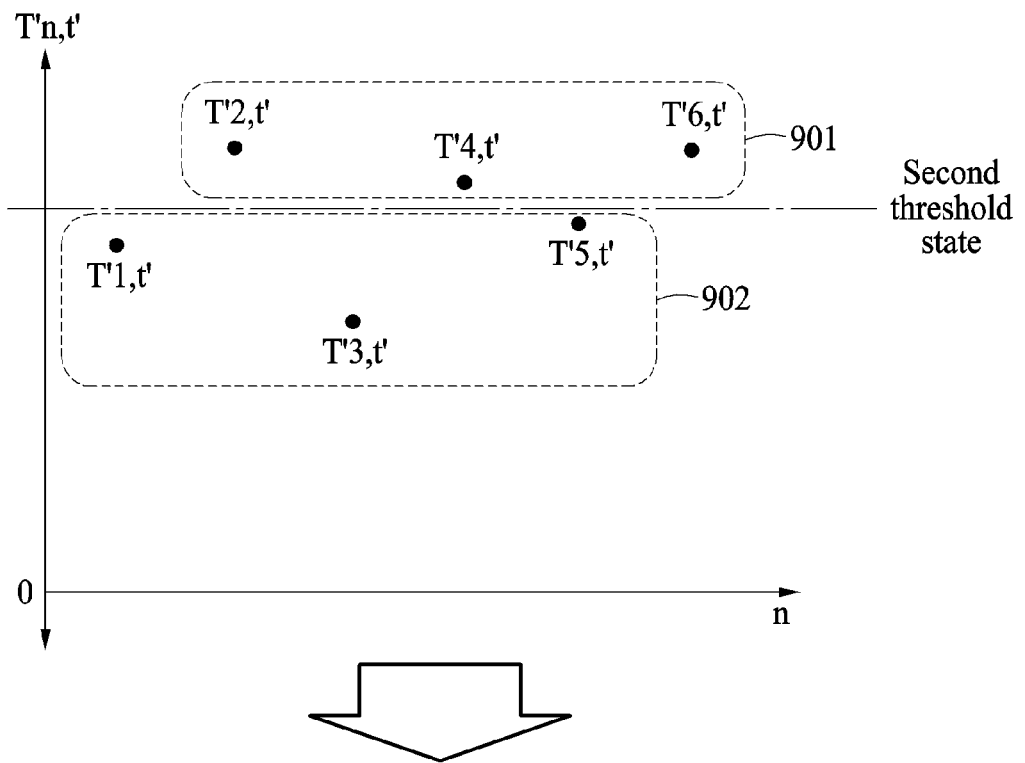
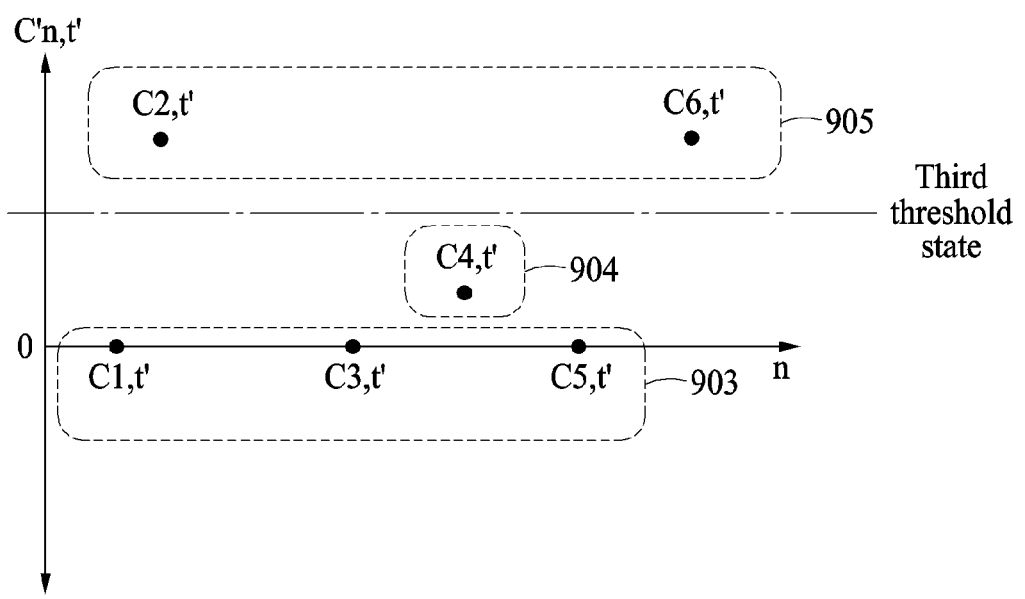

FIG. 10
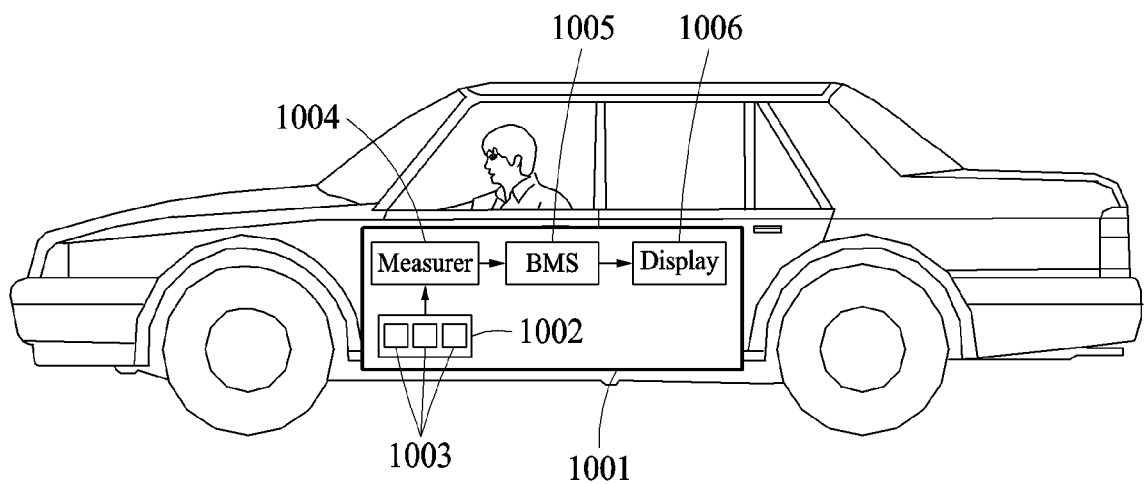
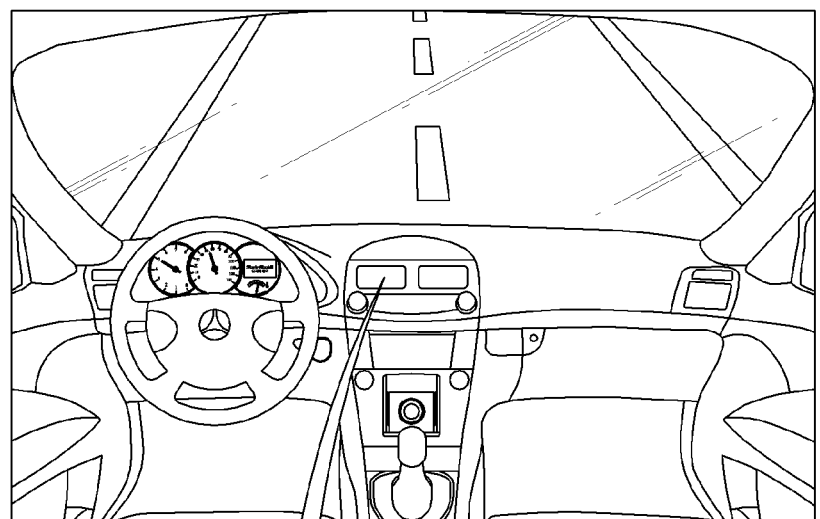
Battery fault detected!
3 module short circuits occurred

METHOD AND APPARATUS TO DETECT BATTERY FAULT

CROSS-REFERENCE TO RELATED APPLICATIONS

This application claims the benefit under 35 USC 119(a) of Korean Patent Application No. 10-2017-0094706 filed on Jul. 26, 2017 in the Korean Intellectual Property Office, the entire disclosure of which is incorporated herein by reference for all purposes.

BACKGROUND

1. Field

The following description relates to a method to detect a battery fault. The following description also relates to an apparatus to detect a battery fault.

2. Description of Related Art

A battery is used as a power source of a mobile device or an electric vehicle. As an increasing number of users use an electric vehicle or a mobile device including such a battery, demand for advanced battery control technology is increasing. Technology to detect a battery fault condition is useful for successful battery control.

To detect a battery fault, a scheme of comparing voltages of modules in a battery or utilizing information related to a deviation of the voltages has been suggested. However, such a scheme of comparing the voltages or using the deviation information may yield different results, based on criteria set for detecting a battery fault. For example, based on using different criteria for detecting a battery fault, noise may be detected as a battery fault, or a battery fault may not be detected even though the battery fault occurs. However, an inaccurate result of detecting a battery fault may expose the battery to aging, and thus a lifespan or a performance of the battery may be negatively influenced.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a processor-implemented method to detect a battery fault includes obtaining first states of detection targets in a battery, generating a representative state based on the first states, generating second states by applying the representative state to each of the first states, generating one or more third states by amplifying at least a portion of the second states, and detecting for a fault of the battery based on the one or more third states.

The detection targets may be modules or cells in the battery.

A first state of a detection target may be a voltage with respect to time, a state of charge (SOC), or a temperature.

The detecting may include detecting for the fault of the battery based on any one or any combination of any two or more of third states generated from voltages of the detection targets, third states generated from SOCs of the detection targets, and third states generated from temperatures of the detection targets.

The generating of the one or more third states may include comparing each of the second states to a second threshold state, selecting a candidate state from the second states based on a result of the comparing, and generating the one or more third states by applying one of the second states to the candidate state.

A first state may be a voltage of a detection target, the second threshold state may be 0, and the selecting may include selecting a candidate state that is less than 0 from the second states.

The generating of the one or more third states may include generating one or more third states corresponding to a candidate state selected from the second states by multiplying a sum of remaining second states, except for the selected candidate state, by the selected candidate state.

The generating of the one or more third states may include generating one or more third states using $$Cn, t' = V'n, t' * \left[ \sum_{1}^{N} (V'x, t') - V'n, t' \right],$$

wherein N denotes a number of the second states, V'n,t' denotes an n-th second state, $$\sum_{1}^{N} (V'x, t')$$

denotes a sum of second states from a first second state to an N-th second state, and Cn,t' denotes a third state corresponding to a candidate state that is the n-th second state.

The generating of the one or more third states comprises generating a third state corresponding to a candidate state selected from the second states based on one or both of a square and an absolute value of the selected candidate state.

The detecting may include comparing the one or more third states to a third threshold state, selecting at least a portion of the one or more third states based on a result of the comparing, and detecting for the fault of the battery based on the selected at least a portion of the one or more third states.

A first state may be a voltage of a detection target, and the third threshold state may be based on a product of a voltage of a first detection target in which a short circuit occurs, from among the detection targets, and a sum of voltages of remaining detection targets, except for the first detection target, from among the detection targets.

The detecting may include generating a sum of the selected at least a portion of the one or more third states, comparing the generated sum to a threshold sum, and detecting for the fault of the battery based on a result of the comparing of the generated sum to the threshold sum.

The detecting may include counting a number of the selected at least a portion of the one or more third states, comparing the counted number to a threshold number, and detecting for the fault of the battery based on a result of the comparing of the counted number to the threshold number.

The detecting may include comparing the one or more third states to a fourth threshold state, and detecting a fault of the battery based on a result of the comparing.

The detecting may include identifying one or more detection targets in which a short circuit occurs from among the detection targets based on the one or more third states.

The generating of the representative state may include, generating a first mean state from the first states, and generating a second mean state corresponding to a time period from the first mean state.

The generating of the second states may include resetting the first states to second states by subtracting the representative state from each of the first states.

In another general aspect, a non-transitory computer-readable storage medium stores instructions that, when executed by a processor, cause the processor to perform the method described above.

In another general aspect, an apparatus to detect a battery fault includes a processor configured to obtain first states of detection targets in a battery, generate a representative state based on the first states, generate second states by applying the representative state to each of the first states, generate one or more third states by amplifying at least a portion of the second states, and detect for a fault of the battery based on the one or more third states.

The detection targets may be modules or cells in the battery, and a first state of a detection target may be a voltage by time, a state of charge (SOC), or a temperature.

Other features and aspects will be apparent from the following detailed description, the drawings, and the claims.

BRIEF DESCRIPTION OF THE DRAWINGS

FIG. 3 illustrates an example of a battery fault detection method.

FIG. 9A illustrates an example of a battery fault detection method.

FIG. 10 illustrates an example of an operation of a battery fault detection apparatus.

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

Figure 1:
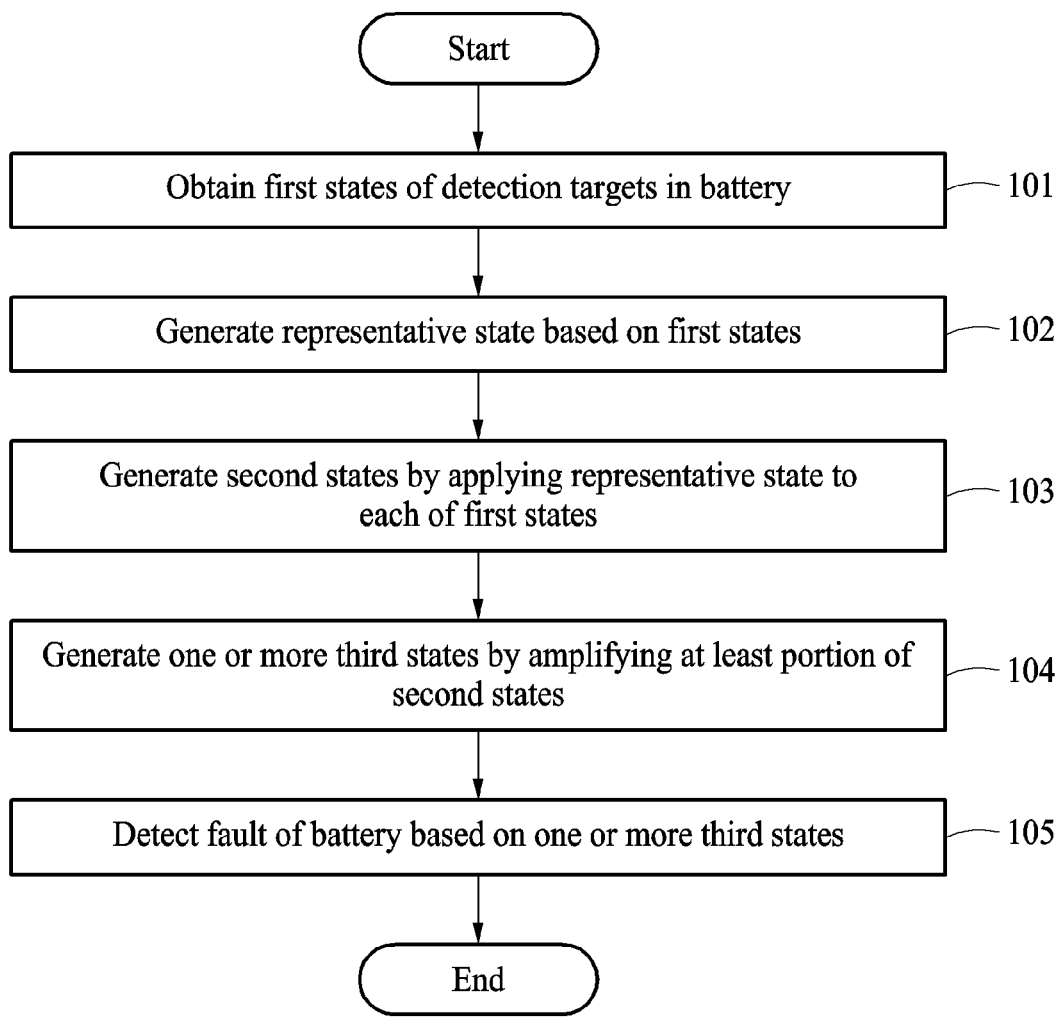
FIG. 1 illustrates an example of a battery fault detection method.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Unless otherwise defined, all terms including technical and scientific terms used herein have the same meaning as commonly understood by one of ordinary skill in the art to which examples belong in view of the present disclosure. It will be further understood that terms, such as those defined in commonly-used dictionaries, should be interpreted as having a meaning that is consistent with their meaning in the context of the relevant art and the present disclosure and will not be interpreted in an idealized or overly formal sense unless expressly so defined herein.

Hereinafter, reference will now be made in detail to examples with reference to the accompanying drawings, wherein like reference numerals refer to like elements throughout.

FIG. 1 illustrates an example of a battery fault detection method.

Referring to the example of FIG. 1, in operation 101, a battery fault detection apparatus obtains first states of detection target units, or detection targets, in a battery. In such an example, the battery fault detection apparatus is an apparatus configured to detect a fault of a battery, and is implemented using, for example, a hardware module. For example, the battery fault detection apparatus is implemented using a battery management system (BMS). The BMS is a system configured to manage a battery, and is configured to monitor a state of a battery, maintain an optimized condition for operating the battery, estimate a time to replace the battery, detect a problem of the battery, generate a control or command signal associated with the battery, and control an operation or the state of the battery.

Obtaining a first state of a detection target includes directly measuring or estimating a first state of a detection target, or obtaining a measured or estimated first state. The battery includes a condenser or a secondary cell configured to store power as a result of a charging operation. An apparatus including a battery supplies power to a load using the battery as the source of the power. The load is a main power consumer used to consume power supplied from an external device, and includes, for example, a motor of an electric vehicle (EV), an electric light, or an electric heater that consumes power using a circuit in which a current flows at a predetermined voltage.

A detection target in the battery is a hardware unit that is a target of battery fault detection, from among elements in the battery. The battery fault detection apparatus measures, estimates, or obtains parameters associated with a state of the battery for each corresponding detection target. In such an example, the battery includes cells. A cell is a unit of a device or element configured to store power. For example, the battery includes cells arranged in series or in parallel. Also, the battery includes modules. In examples, the modules are arranged in series or in parallel. Also, the modules include the cells.

The detection targets are the modules or the cells in the battery. Depending on a design intention or a system efficiency goal, a detection target is a battery pack. The battery includes any one or any combination of any two or more of battery packs including modules, modules in a battery pack, modules including cells, and battery cells in a module. Subsequently, the term "battery" may be understood as referring to the above examples.

A first state of a detection target refers to a battery state measured or estimated from a detection target, for example, a module or a cell, as discussed above, and is expressed using a parameter related to the battery state. The first state is a voltage, a state of charge (SOC), or a temperature of the module or the cell. The SOC is a parameter indicating a charge state of the battery. For example, the SOC indicates an amount of energy stored in the battery, and the amount is indicated as being 0% to 100%. For example, 0% indicates a fully discharged state and 100% indicates a fully charged state. Such a metric is variously modified in varied examples, e.g., defined depending on a design intention or an aspect of such examples.

The voltage or the temperature is measured by an appropriate sensor, and the SOC is estimated by the battery fault detection apparatus or an external device. The voltage, the SOC, or the temperature of the module or the cell is expressed using values with respect to time, and thus such a value is expressed using successive values or discrete values based on a measurement or estimation interval.

Detecting a battery fault includes detecting a fault that occurs in the battery itself, or detecting a fault from one or more of the detection targets in the battery. For example, the battery fault is an external short circuit or an internal short circuit that occurs in the battery itself or in one or more of the detection targets in the battery. Such an external short circuit occurs when a sheath of a wire is peeled off or damaged, exposing the wire to the outside environment.

Accordingly, the battery fault detection apparatus detects a fault of a detection target in which a short circuit occurs, from among the detection targets in the battery, thereby preventing a malfunction, a problem, or deterioration due to aging of the battery, providing stable management of the battery, and increasing a lifespan of the battery. When such a short circuit occurs in a detection target, a resistance of the detection target decreases accordingly, and thus an overcurrent flows in the detection target, which leads to damage to the relevant detection target. Furthermore, although the detection target is not damaged merely because a soft short circuit occurs, consecutive recurring occurrences of such a short circuit reduces the lifespan of the battery or may cause a sudden problem with the battery.

The battery fault detection apparatus utilizes a scheme of removing noise from data related to states of the detection targets and amplifying the states from which the noise has been removed to detect a soft short circuit occurring in the detection targets. A first state refers to a state of a detection target that is a target of noise removal.

A battery fault detection scheme performed without removing noise from a battery state or amplifying the battery state does not clearly distinguish between noise and a soft short circuit, and thus may commit an error of incorrectly determining noise to be a short circuit or alternatively omitting detection of the soft short circuit. Without removal of the noise, soft short circuits in the battery accumulate repeatedly, and the aging of the battery is accelerated as a result. The battery fault detection apparatus therefore distinguishes between noise and a soft short circuit occurring in a detection target through a noise removal operation and an amplification operation, and thus increases an accuracy of short circuit detection over previous technological fault detection approaches, thereby preventing a risk of the battery being continuously exposed to a soft short circuit.

When a short circuit occurs in a detection target, a voltage and an SOC measured or estimated from the detection target decrease, and a temperature of the detection target increases. The battery fault detection apparatus detects a battery fault using a characteristic of the detection target having a first state that changes when a short circuit occurs, and prevents confusion between an occurrence of noise and an occurrence of a soft short circuit through performing the noise removal operation and the amplification operation. For example, the battery fault detection apparatus detects a voltage or an SOC that is less than a standard or a threshold due to an occurrence of a soft short circuit, from among voltages or SOCs of the detection targets, and detects a temperature greater than a standard or a threshold due to the occurrence of the soft short circuit, from among temperatures of the detection targets. In this example, the battery fault detection apparatus performs the noise removal operation and the amplification operation.

The battery fault detection apparatus generates second states from the first states by performing the noise removal operation, and generates one or more third states from at least a portion of the second states by performing the amplification operation. Also, such operations of generating a second state and a third state are described further later. Hereinafter, examples are described based on a case in which the first state is one of a voltage, an SOC, and a temperature. However, in examples, the battery fault detection apparatus detects a fault of the battery based on any one or any combination of any two or more third states generated from the voltages of the detection targets, third states generated from the SOCs of the detection targets, and third states generated from the temperatures of the detection targets.

In operation 102, the battery fault detection apparatus generates a representative state based on the first states of the detection targets. The representative state is a state that represents the first states. The battery fault detection apparatus calculates the representative state from the first states. For example, the battery fault detection apparatus generates the representative state by calculating a statistic that is representative value based on the first states. In such an example, various statistic feature values such as a mean and a median value are used as the statistic representative value.

For example, the battery fault detection apparatus generates a first mean state which is a mean of the first states. The battery fault detection apparatus generates the first mean state by calculating a mean of remaining first states, except for a maximum value and a minimum value among the first states. Omitting the maximum value and the minimum value prevents a distortion of the representative value. Accordingly, the battery fault detection apparatus removes noise included in the first states using the first mean state.

The battery fault detection apparatus then generates a second mean state corresponding to a predefined time period from the first mean state. The first mean state is expressed using a value corresponding to a time. To deduce a representative value corresponding to a predetermined time period, the battery fault detection apparatus generates the second mean state by calculating a mean of the first mean state during the predefined time period. Thus, the battery fault detection apparatus removes the noise included in the first states using the second mean state. In an example, the representative state is the second mean state. For example, the representative state is a state that represents voltages of n modules, and is a mean of the voltages of the n modules during a predefined time period.

In operation 103, the battery fault detection apparatus generates second states by applying the representative state to each of the first states. The battery fault detection apparatus removes noise included in the first states by applying the representative state to each of the first states, and generates noise-free second states. The battery fault detection apparatus resets the first states to the second states by subtracting the representative state from each of the first states.

In operation 104, the battery fault detection apparatus generates one or more third states by amplifying at least a portion of the second states. The battery fault detection apparatus compares each of the second states to a second threshold state. The battery fault detection apparatus selects one or more candidate states from the second states based on a result of the comparison. For example, in an example in which the first state is a voltage of a detection target, the second threshold state is 0. In this example, the battery fault detection apparatus selects one or more candidate states that are less than 0 from the second states. Such an approach is used because a voltage of a detection target in which a short circuit occurs is relatively lower than a voltage of another detection target.

In an example in which the first state is an SOC or a temperature of the detection target, the second threshold state is defined as a value corresponding to the SOC or the temperature. In an example in which the first state is an SOC of the detection target, the battery fault detection apparatus selects one or more candidate states less than the second threshold state from the second states. Such an approach is used because an SOC of a detection target in which a short circuit occurs is relatively lower than an SOC of another detection target. In an example in which the first state is a temperature of the detection target, the battery fault detection apparatus selects one or more candidate states greater than the second threshold state from the second states. Such an approach is used because a temperature of a detection target in which a short circuit occurs is relatively greater than a temperature of another detection target.

The battery fault detection apparatus generates the one or more third states by applying one or more of the second states to the selected one or more candidate states. The battery fault detection apparatus generates a third state from a second state that is a candidate state selected from the second states, and omits an operation of generating a third state from a second state that is not a candidate state or sets a third state corresponding to a second state that is not a candidate state to a predefined value, for example, 0.

To generate a third state corresponding to a candidate state, the battery fault detection apparatus calculates a sum of remaining second states, except for a particular candidate state selected from the second states. The battery fault detection apparatus generates the third state corresponding to the particular candidate state by multiplying the calculated sum by the particular candidate state. For example, the battery fault detection apparatus generates the third state using Equation 1.

$$Cn = Sn * \left[ \sum_{1}^{N} (Sx) - Sn \right] \quad \text{Equation 1}$$

In Equation 1, N denotes a number of second states. Sn denotes an n-th second state.

$$\sum_{1}^{N} (Sx)$$

denotes a sum of second states from a first second state to an N-th second state. Cn denotes a third state corresponding to a candidate state that is the n-th second state.

The battery fault detection apparatus generates a third state corresponding to a candidate state that is a second state by calculating one or both of a square and an absolute value of the candidate state. A scheme of calculating the third state is not limited to such an approach. For example, a variety of mathematical or statistical operations used to amplify a second state being a candidate state are potentially adopted for such calculating.

In operation 105, the battery fault detection apparatus detects a fault of the battery based on the one or more third states. As described above, the third state corresponds to a second state that is a candidate state from among the second states.

The battery fault detection apparatus compares the one or more third states to a third threshold state. The third threshold state is a reference value that is to be compared to the third state. Such a third threshold state is theoretically or experimentally defined in advance of the operation of the battery fault detection apparatus. For example, in an example in which the third state is defined by Equation 1 and the first state is a voltage, the third threshold state is defined by the product of the voltage of the detection target in which a short circuit occurs from among detection targets and the sum of voltages of detection targets in which a short circuit does not occur. In such an example, the voltage of the detection target in which the short circuit occurs is a voltage at which the occurrence of the short circuit is initiated. In an example in which the first state is an SOC, the third threshold state is defined by the product of the SOC of a detection target in which short circuit occurs from among detection targets and the sum of SOCs of detection targets in which short circuit does not occur. In an example in which the first state is a temperature, the third threshold state is defined by the product of the temperature of detection target in which a short circuit occurs from among detection targets and the sum of temperatures of detection targets in which a short circuit does not occur.

The battery fault detection apparatus selects at least a portion of the one or more third states based on a result of the comparison. For example, in an example in which the first state is a voltage or an SOC, the battery fault detection apparatus selects a third state that is less than the third threshold state from among the third states. In an example in which the first state is a temperature, the battery fault detection apparatus selects a third state that is greater than the third threshold state from among the third states. Such an approach is used because a voltage or an SOC of a module or a cell decreases and a temperature of the module or the cell increases when a short circuit occurs.

The battery fault detection apparatus determines whether a fault of the battery occurs by using a scheme of accumulating the selected at least a portion of the one or more third states. The battery fault detection apparatus detects a fault of the battery based on a sum of the selected at least a portion of the one or more third states. The battery fault detection apparatus compares the sum of the selected at least a portion of the one or more third states to a threshold sum, and detects a fault of the battery based on a result of the comparison. For example, in an example in which the first state is a voltage or an SOC, the battery fault detection apparatus determines that a fault of the battery occurs in response to the sum of the selected at least a portion of the one or more third states being less than the threshold sum. In an example in which the first state is a temperature, the battery fault detection apparatus determines that a fault of the battery occurs in response to the sum of the selected at least a portion of the one or more third states being greater than the threshold sum. In response to a determination that a fault of the battery occurs, the battery fault detection apparatus identifies one or more detection targets in which a short circuit occurs from among the detection targets based on the selected at least a portion of the one or more third states.

The battery fault detection apparatus determines whether a fault of the battery occurs by using a scheme of counting a number of the selected at least a portion of the one or more third states. The battery fault detection apparatus counts the number of the selected at least a portion of the one or more third states. The battery fault detection apparatus compares the counted number to a threshold number. The threshold number is predefined and changed in varied examples, e.g., appropriately based on design intent or a performance aspect such as a sensitivity of battery fault detection in such varied examples. The battery fault detection apparatus detects a fault of the battery based on a result of the comparison. For example, the battery fault detection apparatus determines that a fault of the battery occurs in response to the counted number exceeding the threshold number. In response to a determination that a fault of the battery occurs, the battery fault detection apparatus identifies one or more detection targets in which a short circuit occurs from among the detection targets, based on the selected at least a portion of the one or more third states.

The battery fault detection apparatus determines whether a fault of the battery occurs by using an approach of comparing a third state to a fourth threshold state. In an example, the battery fault detection apparatus compares the one or more third states generated in operation 104 to the fourth threshold state, and detects a fault of the battery based on a result of the comparison.

For example, the fourth threshold state is set to a value corresponding to a more serious short circuit than that of the third threshold state. An approach of using the result of the comparison to the fourth threshold state determines whether a fault of the battery occurs directly from the result of the comparison, unlike the approach of accumulating the one or more third states or counting the number of the one or more third states. Therefore, the fourth threshold state is set to be more conservative than the third threshold state for short circuit detection. For example, in an example in which the first state is a voltage or an SOC, the fourth threshold state is set to be less than the third threshold state. In an example in which the first state is a temperature, the fourth threshold state is set to be greater than the third threshold state. In an example in which the first state is a voltage or an SOC, the battery fault detection apparatus determines that a fault of the battery occurs in response to the third state being less than the fourth threshold state. In an example in which the first state is a temperature, the battery fault detection apparatus determines that a fault of the battery occurs in response to the third state being greater than the fourth threshold state. In response to a determination that a fault of the battery occurs, the battery fault detection apparatus identifies one or more detection targets in which a short circuit occurs, from among the detection targets, based on the one or more third states.

Subsequently, based on a premise that the first state is a voltage, a battery fault detection method using an approach of accumulating third states is described further with reference to FIGS. 2 through 4, a battery fault detection method using an approach of counting a number of third states is described further with reference to FIGS. 5 and 6, and a battery fault detection method using an approach of comparing a third state to a fourth threshold state is described further with reference to FIGS. 7 and 8.

Figure 2:
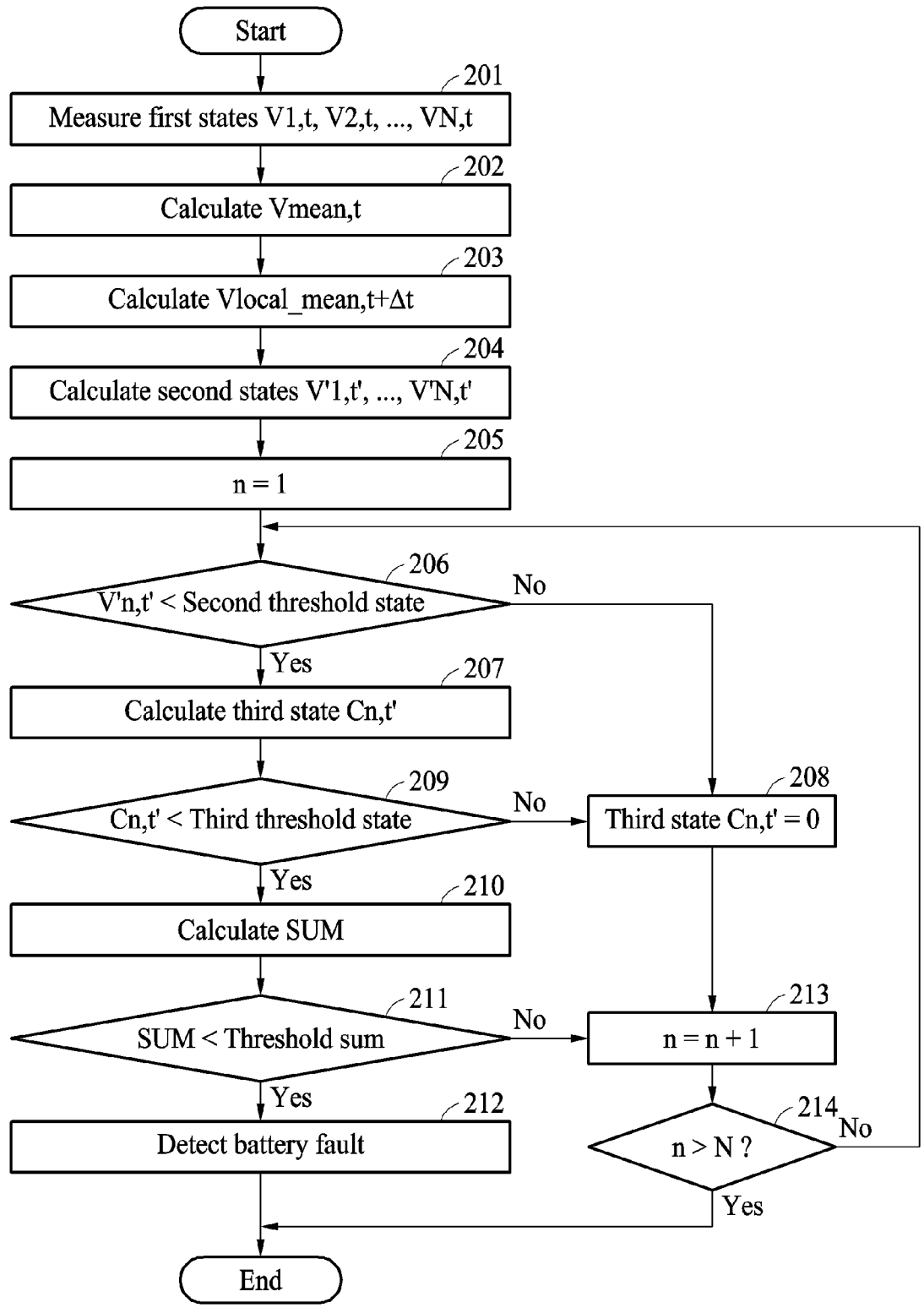
FIG. 2 illustrates an example of a battery fault detection method.

FIG. 2 illustrates an example of a battery fault detection method.

Referring to the example of FIG. 2, in operation 201, a battery fault detection apparatus measures first states V1,t, V2,t, . . . , VN,t of N detection targets. V1,t, V2,t, . . . , VN,t are each respective voltages of the N detection targets, and are each expressed as voltages with respect to a time t.

In operation 202, the battery fault detection apparatus calculates a first mean state Vmean,t from V1,t, V2,t, . . . , VN,t using Equation 2.

$$Vmean, t = \left[\sum_{1}^{N}(Vx, t) - Vmax, t - Vmin, t\right] / (N-2) \quad \text{Equation 2}$$

In Equation 2, N denotes a number of detection targets, $$\sum_{t}^{N}(Vx, t)$$

denotes a sum of V1,t, V2,t, . . . , VN,t, Vmax,t denotes a maximum value among V1,t, V2,t, . . . , VN,t, and Vmin,t denotes a minimum value from among V1,t, V2,t, . . . , VN,t.

In operation 203, the battery fault detection apparatus calculates a second mean state Vlocal_mean,t+Δt corresponding to a predefined time period Δt from the first mean state Vmean,t by using Equation 3, below.

$$Vlocal\_mean, t + \Delta t = \left[\sum_{t}^{t+\Delta t}(Vmean, x)\right] / \Delta t \quad \text{Equation 3}$$

In Equation 3, $$\sum_{t}^{t+\Delta t}(Vmean, x)$$

denotes a sum of Vmean,t during a predefined time period Δt.

A representative state is the second mean state Vlocal_mean,t+Δt.

In operation 204, the battery fault detection apparatus calculates second states V'1,t', . . . , V'N,t' from the representative state Vlocal_mean,t+Δt and the first states V1,t, V2,t, . . . , VN,t using Equation 4, below.

$$V'n,t' = Vn,t+\Delta t - Vlocal\_mean,t+\Delta t \quad \text{Equation 4}$$

In Equation 4, Vn,t+Δt is an n-th first state in a predefined time period Δt, and V'n,t' is an n-th second state from among second states.

The battery fault detection apparatus calculates the second states V'1,t', . . . , V'N,t' by removing noise from the first states, for example, voltages, V1,t, V2,t, . . . , VN,t of the detection targets through the process described above. The battery fault detection apparatus calculates third states C1,C', . . . , C'N,t' from the second states V'1,t', . . . , V'N,t' by comparing the second states V'1,t', . . . , V'N,t' to a second threshold state.

In operation 205, the battery fault detection apparatus performs an operation of setting n=1. In operation 206, the battery fault detection apparatus compares the second state V'n,t' to the second threshold state. The battery fault detection apparatus determines a second state V'n,t' that is less than the second threshold state to be a candidate state.

In operation 207, the battery fault detection apparatus calculates a third state Cn,t' using Equation 5, below, in response to V'n,t' being less than the second threshold state.

$$Cn, t' = V'n, t' * \left[\sum_{1}^{N}(V'x, t') - V'n, t'\right] \quad \text{Equation 5}$$

In Equation 5, V'n,t' denotes an n-th second state, $$\sum_{1}^{N}(V'x, t')$$

denotes a sum of second states from a first second state to an N-th second state, and Cn,t' denotes a third state corresponding to a candidate state that is the n-th second state.

In operation 208, the battery fault detection apparatus sets an n-th third state Cn,t' to 0 in response to the second state V'n,t' being greater than the second threshold state.

In operation 209, the battery fault detection apparatus compares the third state Cn,t' to a third threshold state. In such an example, the third threshold state $C_{Ref}$ is defined as expressed by Equation 6, below.

$$C_{Ref} = I(R-R') * ((N-1)*IR) = (N-1)*I*R*(R-R') \quad \text{Equation 6}$$

In Equation 6, I denotes a current of N detection targets, R denotes a resistance of a detection target in which a short circuit does not occur, and (R−R') denotes a resistance of a detection target in which a short circuit occurs.

The third threshold state $C_{Ref}$ is experimentally deduced based on a premise that a short circuit occurs in one of the detection targets. In Equation 6, I(R−R') denotes a voltage of the detection target in which a short circuit occurs, and ((N−1)*IR) denotes a sum of voltages of the remaining detection targets in which a short circuit does not occur.

In operation 210, the battery fault detection apparatus calculates a sum SUM of third states using Equation 7, below, in response to the third state Cn,t' being less than the third threshold state.

$$SUM = \sum_{1}^{N}(Cn, t') \quad \text{Equation 7}$$

In Equation 7, $$\sum_{1}^{N}(Cn, t')$$

denotes a sum of third states from a first third state to an N-th third state.

The sum SUM of the third states refers to a cumulative sum of third states that are less than the third threshold state, from among third states corresponding to candidate states. SUM is derived in this manner because a third state corresponding to a second state that is not a candidate state is set to 0 and a third state that is greater than the third threshold state from among the third states corresponding to the candidate states is set to 0. Subsequently, an example of distributions of second states and third states are described further with reference to FIG. 3.

FIG. 3 illustrates an example of a battery fault detection method.

Referring to the example of FIG. 3, in an example in which a second threshold state is set to 0, from among second states $V'1,t', \ldots, V'6,t'$, second states $V'2,t', V'4,t'$ and $V'6,t'$ 301 are greater than the second threshold state and second states $V'1,t', V'3,t'$ and $V'5,t'$ 302 are less than the second threshold state.

A battery fault detection apparatus determines the second states $V'1,t', V'3,t'$ and $V'5,t'$ 302 to be candidate states, and calculates third states $C1,t'$ 304, $C3,t'$ 305 and $C5,t'$ 304 from the candidate states $V'1,t', V'3,t'$ and $V'5,t'$ 302, respectively. For example, the calculation is performed using $C3,t'=V'3, t'*(V'1,t'+V'2,t'+V'4,t'+V'5,t'+V'6,t')$. The battery fault detection apparatus sets third states $C2,t', C4,t'$ and $C6,t'$ 303, corresponding to the second states $V'2,t', V'4,t'$ and $V'6,t'$ 301, to 0.

In the example of FIG. 3, the third states $C1,t'$ and $C5,t'$ 304 are greater than a third threshold state, and the third state $C3,t'$ 305 is less than the third threshold state. Thus, the battery fault detection apparatus resets $C1,t'$ and $C5,t'$ 304 to 0, and adds $C3,t'$ 305 to the sum SUM of the third states.

In operation 211, the battery fault detection apparatus compares the sum SUM of the third states to a threshold sum. In response to the sum SUM of the third states being less than the threshold sum, the battery fault detection apparatus detects a fault of the battery, in operation 212. In response to the sum SUM of the third states being greater than the threshold sum, the battery fault detection apparatus performs an operation of setting n=n+1 to increase the value of n, in operation 213. The battery fault detection apparatus compares n to N, in operation 214.

Accordingly, the battery fault detection apparatus iteratively performs the above operations or terminates the battery fault detection method based on a result of the comparison. Subsequently, an example of a battery fault detection operation using a sum of third states is described further with reference to FIG. 4.

Figure 4:
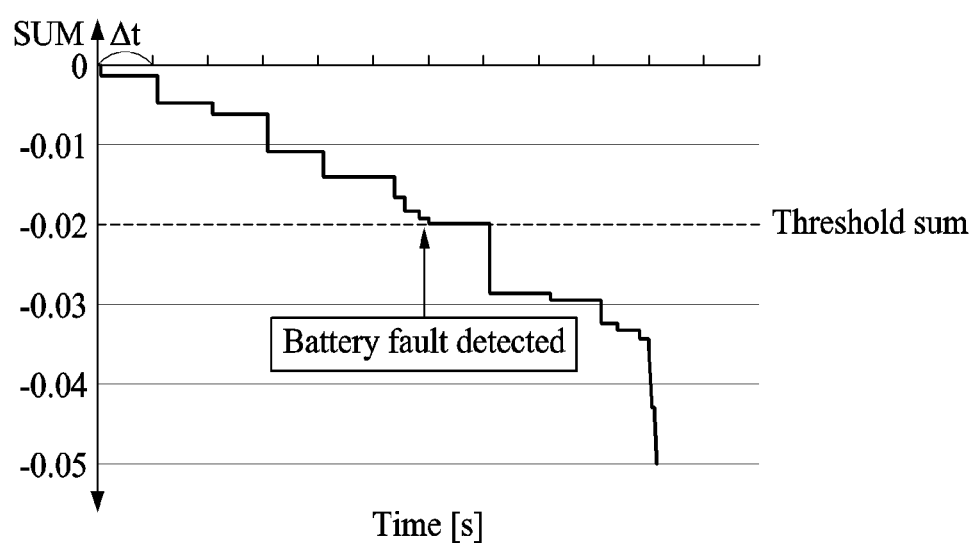
FIG. 4 illustrates an example of a battery fault detection method.

FIG. 4 illustrates an example of a battery fault detection method.

Referring to the example of FIG. 4, a battery fault detection apparatus compares a sum SUM of third states to a threshold sum, and detects a fault of a battery in response to the sum SUM of the third states being less than the threshold sum. In the example of FIG. 4, $\Delta t$ is the predefined period described above, and $\Delta t$ denotes an interval used when generating a second state. The battery fault detection apparatus detects a fault of the battery based on a cumulative sum of the third states.

Figure 5:
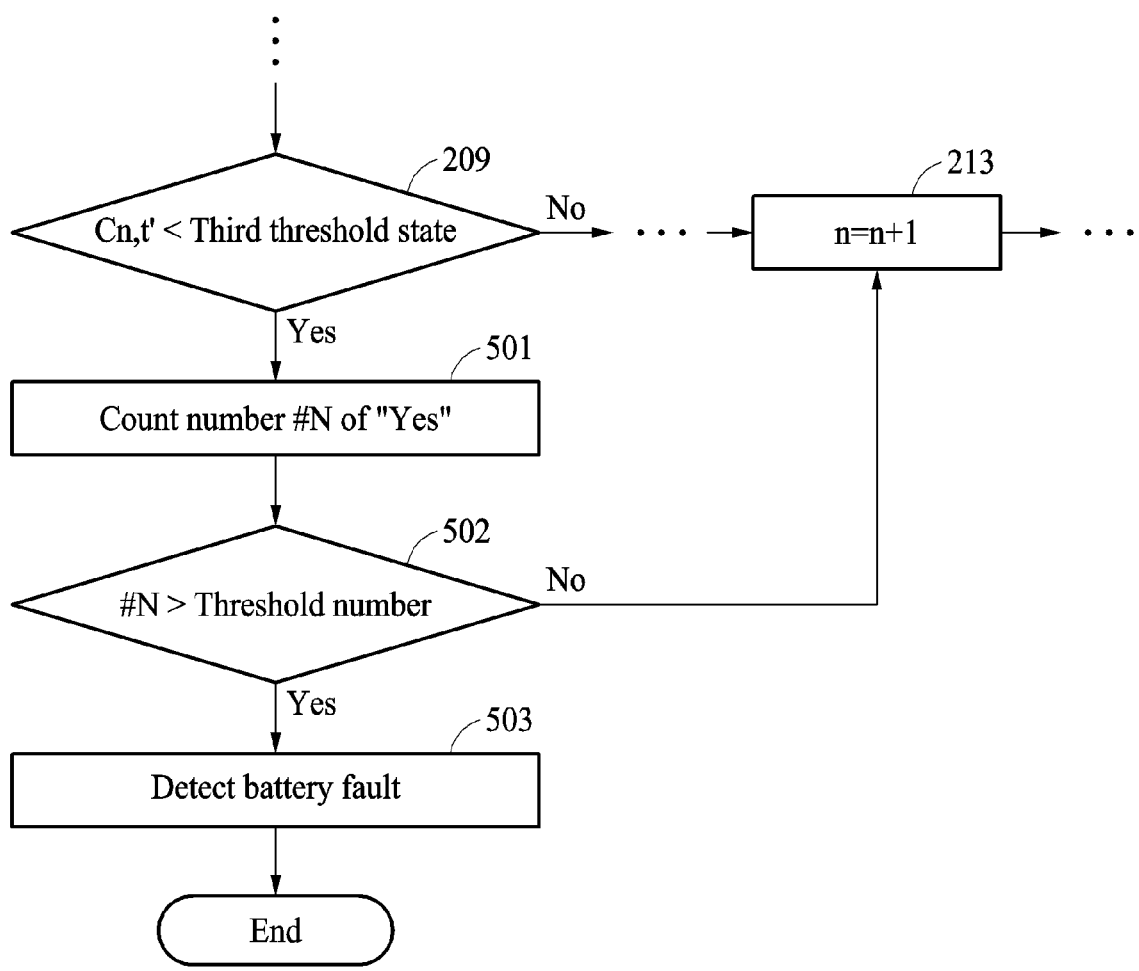
FIG. 5 illustrates an example of a battery fault detection method.

FIG. 5 illustrates an example of a battery fault detection method.

A battery fault detection apparatus detects a fault of a battery by counting a number of at least a portion of the third states. Referring to the example of FIG. 5, the battery fault detection apparatus compares third states $C1,t', \ldots, C'N,t'$ to a third threshold state, which is the same operation as operation 209 of FIG. 2.

In response to the third state $Cn,t'$ being less than the third threshold state, the battery fault detection apparatus counts a number # N of third states that is less than the total number of third threshold states, in operation 501. In response to the third state $Cn,t'$ being less than the third threshold state, the battery fault detection apparatus increases a value of # N by 1.

In operation 502, the battery fault detection apparatus compares the number # N of the third states that are less than the third threshold state to a threshold number. In response to the number # N of the third states that are less than the third threshold state being greater than the threshold number, the battery fault detection apparatus detects a fault of the battery, in operation 503. In response to # N being less than or equal to the threshold number, the battery fault detection apparatus performs an operation of n=n+1, thereby increasing n, in operation 213. Subsequent operations are the same as the similar operations described above with reference to FIG. 2. As discussed below, an example of a battery fault detection operation using a number # N of third states that are less than a third threshold state is described further with reference to FIG. 6.

Figure 6:
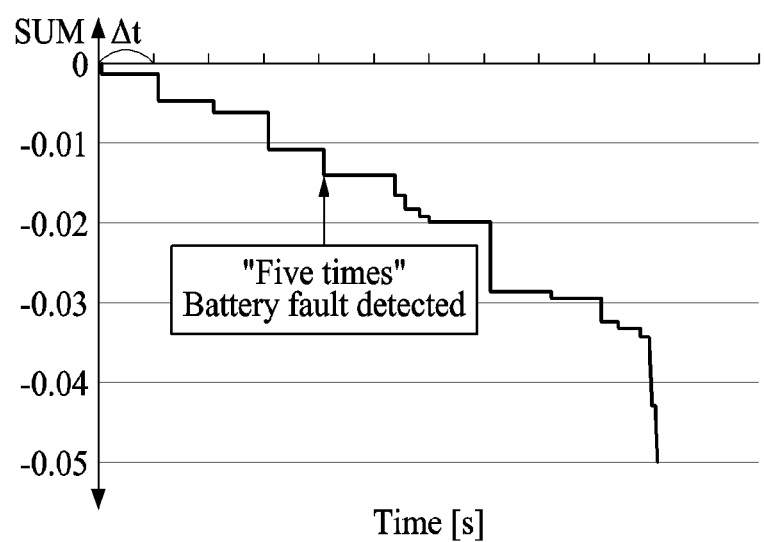
FIG. 6 illustrates an example of a battery fault detection method.

FIG. 6 illustrates an example of a battery fault detection method.

Referring to the example of FIG. 6, a battery fault detection apparatus compares a number 5 of third states that are less than a third threshold state to a threshold number, and detects a fault of a battery based on a result of the comparison. The battery fault detection apparatus detects a fault of the battery based on the number of the third states that are less than the third threshold state.

Figure 7:
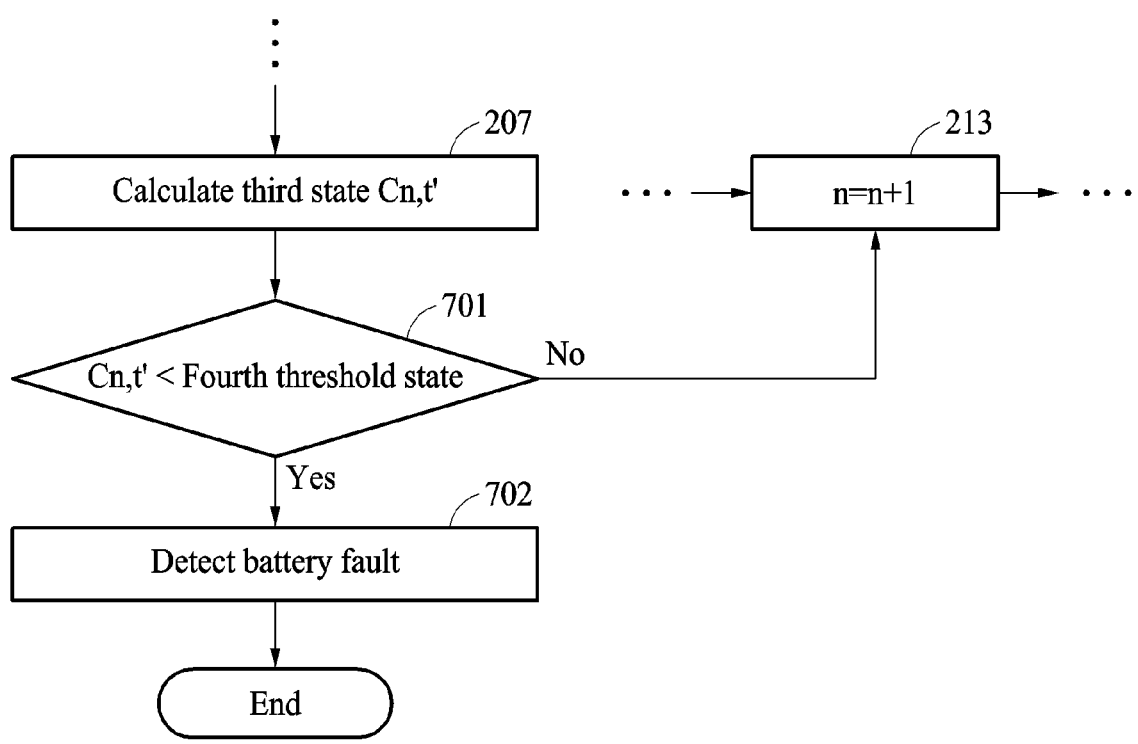
FIG. 7 illustrates an example of a battery fault detection method.

FIG. 7 illustrates an example of a battery fault detection method.

A battery fault detection apparatus detects a fault of a battery in a case in which there is a third state that is less than a fourth threshold state from among third states. Referring to the example of FIG. 7, the battery fault detection apparatus calculates third states $C1,t', \ldots, C'N,t'$, which is the same operation as operation 207 of FIG. 2.

In operation 701, the battery fault detection apparatus compares a third state $Cn,t'$ to a fourth threshold state. As described above, the fourth threshold state is set to a value corresponding to a more serious short circuit than the short circuit associated with the third threshold state. Thus, the fourth threshold state is set to be less than the third threshold state described above with reference to the example of FIG. 2.

In response to the third state $Cn,t'$ being less than the fourth threshold state, the battery fault detection apparatus detects a fault of a battery, in operation 702. In response to the third state $Cn,t'$ being greater than or equal to the fourth threshold state, the battery fault detection apparatus performs an operation n=n+1 in which n is increased by 1, in operation 213. Subsequent operations are the same as the corresponding operations described above with reference to the example of FIG. 2. Below, an example of a battery fault detection operation in response to detection of a third state less than a fourth threshold state is described further with reference to the example of FIG. 8.

Figure 8:
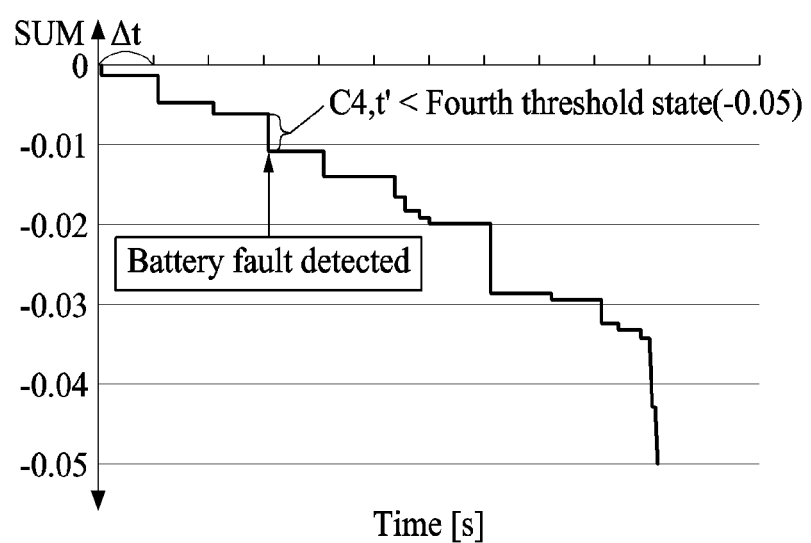
FIG. 8 illustrates an example of a battery fault detection method.

FIG. 8 illustrates an example of a battery fault detection method.

Referring to the example of FIG. 8, a battery fault detection apparatus detects a fault of a battery in response to a detection of a third state $C4,t'$ that is less than a fourth threshold state, for example, −0.05. The battery fault detection apparatus detects a fault of the battery in response to a detection of the third state being less than the fourth threshold state. In an example in which the first state is an SOC, the battery fault detection apparatus detects a fault of the battery, in a similar manner, by performing the above operations.

Figure 9B:
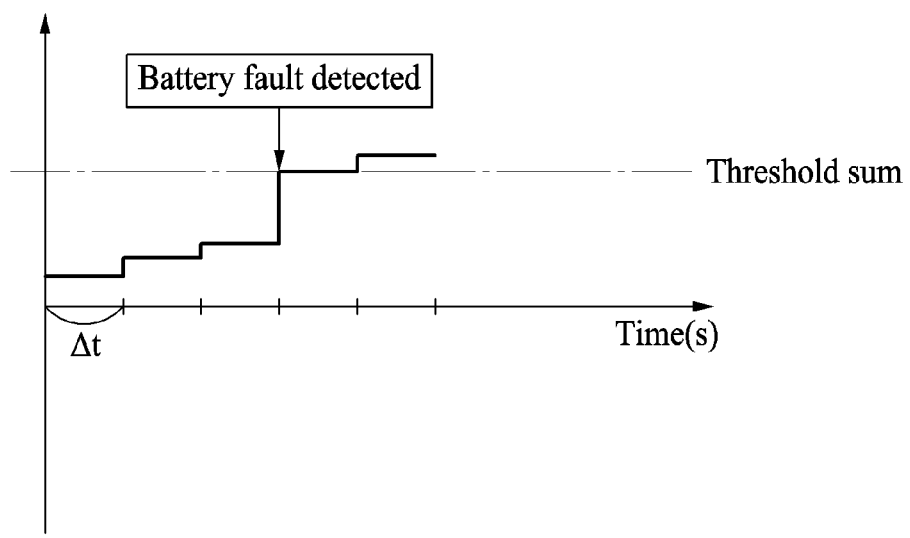
FIG. 9B illustrates an example of a battery fault detection method.

FIGS. 9A and 9B illustrate an example of a battery fault detection method.

As described above, in an example in which the first state is a temperature, a temperature of any one detection target in which a short circuit occurs, from among detection targets, is higher than temperatures of other remaining detection targets. In an example in which the first state is a temperature, a battery fault detection apparatus calculates second states T'1,t', . . . , T'N,t' as described above, and detects a fault of the battery by performing a comparison operation in a reverse manner with respect to an example in which the first state is a voltage.

Referring to the example of FIG. 9A, the battery fault detection apparatus compares second states T1,t', . . . , T'6,t' to a second threshold state. The battery fault detection apparatus determines second states T'2,t', T'4,t' and T'6,t' 901 that are greater than the second threshold state, from among the second states T1,t', . . . , T'6,t', to be candidate states, and calculates third states C2,t' 905, C4,t' 904 and C6,t' 905 from the candidate states T'2,t', T'4,t' and T'6,t' 901, respectively. Also, the battery fault detection apparatus sets third states C1,t', C3,t' and C5,t' 903 corresponding to be the second states T'1,t', T'3,t' and T'5,t' 902 that are less than the second threshold state, from among the second states T'1,t', . . . , T'6,t', to 0.

In the example of FIG. 9A, the third states C2,t' and C6,t' 905 are greater a third threshold state, and the third state C4,t' 904 is less than the third threshold state. Thus, the battery fault detection apparatus resets C4,t' 904 to 0, and adds C2,t' and C6,t' 905 to a sum SUM of the third states.

Referring to the example of FIG. 9B, the battery fault detection apparatus detects a fault of the battery in response to the sum SUM of the third states being greater than a threshold sum. In addition, the battery fault detection apparatus detects a fault of the battery based on a number of third states that are greater than the third threshold state, or detects a fault of the battery in response to a detection of a third state that is greater than a fourth threshold state. The above description applies to an operation of the battery fault detection apparatus for detecting a fault of the battery in an example in which the first state is a temperature, and thus duplicated description of previously discussed material is omitted for brevity.

FIG. 10 illustrates an example of an operation of a battery fault detection apparatus.

Referring to the example of FIG. 10, a battery fault detection apparatus 1001 detects a fault of a battery 1002. The battery 1002 includes detection targets 1003. The battery fault detection apparatus 1001 measures or estimates first states of the detection targets 1003 using a measurer 1004. The battery fault detection apparatus 1001 detects a fault of the battery 1002 using a BMS 1005, and displays an occurrence of the fault of the battery 1002 through a display 1006. In such an example, the battery fault detection apparatus 1001 identifies a module in which a short circuit occurs from among modules in the battery 1002, and displays information of the identified module on the display 1006.

Figure 11:
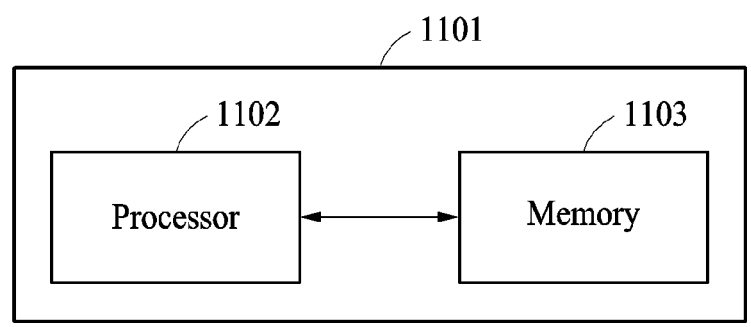
FIG. 11 illustrates an example of a configuration of a battery fault detection apparatus.

FIG. 11 illustrates an example of a configuration of a battery fault detection apparatus.

Referring to the example of FIG. 11, a battery fault detection apparatus 1101 includes a processor 1102 and a memory 1103. The processor 1102 is representative of, or included in, one or more or all of the apparatuses described with reference to FIGS. 1 through 10, or performs one or more or all of the operations or methods described with reference to FIGS. 1 through 10. In such an example, the memory 1103 may be configured to store a program that, when executed by the processor 1102, causes the processor 1102 to implement any or all of the operations of a battery fault detection method described herein. For example, the memory 1103 is a volatile memory or a non-volatile memory.

The processor 1102 executes the program and controls the battery fault detection apparatus 1101. Code included in the program executed by the processor 1102 is stored in the memory 1103. The battery fault detection apparatus 1101 is connected to an external device, for example, a personal computer or a network, through an input/output device, and exchanges data with the external device.

The battery fault detection apparatuses 1001 and 1101, and other apparatuses, units, modules, devices, and other components described in FIGS. 10 and 11 that perform the operations described in this application, such as battery 1002, detection targets 1003, measurer 1004, BMS 1005, display 1006, processor 1102, and memory 1103 are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-9B that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A processor-implemented method to detect a battery fault, the method comprising:
   obtaining first states of detection targets in a battery;
   generating a representative state based on the first states;
   generating second states by applying the representative state to each of the first states;
   selecting one or more candidate states from the second states;
   generating one or more third states based on the one or more candidate states and one or more of the second states; and
   detecting for the fault of the battery based on the one or more third states.

2. The method of claim 1, wherein the detection targets are modules or cells in the battery.

3. The method of claim 1, wherein a first state of a detection target is a voltage with respect to time, a state of charge (SOC), or a temperature.

4. The method of claim 3, wherein the detecting comprises detecting for the fault of the battery based on any one or any combination of any two or more of third states generated from voltages of the detection targets, third states generated from SOCs of the detection targets, and third states generated from temperatures of the detection targets.

5. The method of claim 1, wherein the selecting of the one or more candidate states includes:
   comparing each of the second states to a second threshold state; and
   selecting a candidate state from the second states based on a result of the comparing, and
   wherein the generating of the one or more third states includes generating the one or more third states by applying one of the second states to the candidate state.

6. The method of claim 5, wherein a first state is a voltage of a detection target, the second threshold state is 0, and the selecting comprises selecting the candidate state that is less than 0 from the second states.

7. The method of claim 5, wherein the generating of the one or more third states comprises generating one or more third states corresponding to the candidate state selected from the second states by multiplying a sum of remaining second states, except for the selected candidate state, by the selected candidate state.

8. The method of claim 5, wherein the generating of the one or more third states comprises generating one or more third states using $$Cn, t' = V'n, t' * \left[ \sum_{1}^{N} (V'x, t') - V'n, t' \right],$$

wherein N denotes a number of the second states, V'n,t' denotes an n-th second state, $$\sum_{1}^{N} (V'x, t')$$

denotes a sum of second states from a first second state to an N-th second state, and Cn,t' denotes a third state corresponding to a candidate state that is the n-th second state.

9. The method of claim 5, wherein the generating of the one or more third states comprises generating a third state corresponding to the candidate state selected from the second states based on one or both of a square and an absolute value of the selected candidate state.

10. The method of claim 1, wherein the detecting comprises:
comparing the one or more third states to a fourth threshold state; and
detecting a fault of the battery based on a result of the comparing.

11. The method of claim 1, wherein the detecting comprises identifying one or more detection targets in which a short circuit occurs from among the detection targets based on the one or more third states.

12. The method of claim 1, wherein the generating of the representative state comprises:
generating a first mean state from the first states; and
generating a second mean state corresponding to a time period from the first mean state.

13. The method of claim 1, wherein the generating of the second states comprises resetting the first states to second states by subtracting the representative state from each of the first states.

14. A non-transitory computer-readable storage medium storing instructions that, when executed by a processor, cause the processor to perform the method of claim 1.

15. The method of claim 1, wherein the generating of the one or more third states is performed by one or more processors of an apparatus, and the method further comprises controlling the apparatus based on the detected fault of the battery.

16. The method of claim 15, further comprising controlling the apparatus based on the detected fault of the battery by indicating a result of the detected fault of the battery.

17. The method of claim 1, wherein the detecting comprises:
comparing the one or more third states to a third threshold state;
selecting at least a portion of the one or more third states based on a result of the comparing; and
detecting for the fault of the battery based on the selected at least a portion of the one or more third states.

18. The method of claim 17, wherein a first state is a voltage of a detection target, and
the third threshold state is based on a product of a voltage of a first detection target in which a short circuit occurs, from among the detection targets, and a sum of voltages of remaining detection targets, except for the first detection target, from among the detection targets.

19. The method of claim 17, wherein the detecting comprises:
generating a sum of the selected at least a portion of the one or more third states;
comparing the generated sum to a threshold sum; and
detecting for the fault of the battery based on a result of the comparing of the generated sum to the threshold sum.

20. The method of claim 17, wherein the detecting comprises:
counting a number of the selected at least a portion of the one or more third states;
comparing the counted number to a threshold number; and
detecting for the fault of the battery based on a result of the comparing of the counted number to the threshold number.

21. A processor-implemented method to detect a battery fault, the method comprising:
obtaining first states of detection targets in a battery;
generating a representative state based on the first states;
generating second states by applying the representative state to each of the first states;
generating one or more third states based on at least a portion of the second states; and
detecting for a fault of the battery based on the one or more third states, wherein the detecting comprises:
comparing the one or more third states to a third threshold state;
selecting at least a portion of the one or more third states based on a result of the comparing, and
detecting for the fault of the battery based on the selected at least a portion of the one or more third states.

22. The method of claim 21, wherein a first state is a voltage of a detection target, and
the third threshold state is based on a product of a voltage of a first detection target in which a short circuit occurs, from among the detection targets, and a sum of voltages of remaining detection targets, except for the first detection target, from among the detection targets.

23. The method of claim 21, wherein the detecting comprises:
generating a sum of the selected at least a portion of the one or more third states;
comparing the generated sum to a threshold sum; and
detecting for the fault of the battery based on a result of the comparing of the generated sum to the threshold sum.

24. The method of claim 21, wherein the detecting comprises:
counting a number of the selected at least a portion of the one or more third states;
comparing the counted number to a threshold number; and
detecting for the fault of the battery based on a result of the comparing of the counted number to the threshold number.

25. An apparatus to detect a battery fault, the apparatus comprising:
a processor configured to obtain first states of detection targets in a battery, generate a representative state based on the first states, generate second states by applying the representative state to each of the first states, select one or more candidate states from the second states, generate one or more third states by based on the one or more candidate states and one or more of the second states, detect for the fault of the battery based on the one or more third states.

26. The apparatus of claim 25, wherein the detection targets are modules or cells in the battery, and
a first state of a detection target is a voltage by time, a state of charge (SOC), or a temperature.

27. The apparatus of claim 25, wherein the processor is further configured to control the apparatus based on a result of the detecting for the fault of the battery by indicating the result of the detection for the fault of the battery.

28. The apparatus of claim 25, wherein the processor is further configured to control the apparatus based on a result of the detection for the fault of the battery.

* * * * *